(12) United States Patent
Lin et al.

(10) Patent No.: US 12,236,077 B2
(45) Date of Patent: Feb. 25, 2025

(54) METHODS AND MECHANISMS FOR GENERATING VIRTUAL KNOBS FOR MODEL PERFORMANCE TUNING

(71) Applicant: Applied Materials, Inc., Santa Clara, CA (US)

(72) Inventors: Jui-Che Lin, Taipei (TW); Yan-Jhu Chen, Taoyuan (TW); Chao-Hsien Lee, Taoyuan (TW); Shauh-Teh Juang, Zhubei (TW); Pengyu Han, Freemont, CA (US); Wallace Wang, Hsinchu (TW)

(73) Assignee: Applied Materials, Inc., Santa Clara, CA (US)

( * ) Notice: Subject to any disclaimer, the term of this patent is extended or adjusted under 35 U.S.C. 154(b) by 131 days.

(21) Appl. No.: 17/728,021

(22) Filed: Apr. 25, 2022

(65) Prior Publication Data

US 2023/0342016 A1     Oct. 26, 2023

(51) Int. Cl.
*G06F 3/04847* (2022.01)
*G06F 3/0481* (2022.01)
*H01L 21/02* (2006.01)

(52) U.S. Cl.
CPC ........ *G06F 3/04847* (2013.01); *G06F 3/0481* (2013.01); *H01L 21/02104* (2013.01)

(58) Field of Classification Search
CPC ... G06F 3/04847; G06F 3/0481; G06N 20/00; H01L 21/02104
See application file for complete search history.

(56) References Cited

U.S. PATENT DOCUMENTS

| | | | | |
|---|---|---|---|---|
| 7,720,552 B1 * | 5/2010 | Lloyd | ................. | G06F 3/04847 345/184 |
| 2009/0198635 A1 * | 8/2009 | Doddi | .................... | G01B 11/24 706/12 |
| 2020/0110390 A1 * | 4/2020 | Banna | ............... | G05B 19/41875 |
| 2020/0279066 A1 * | 9/2020 | Banna | ..................... | G06F 30/39 |
| 2022/0043405 A1 * | 2/2022 | Kim | ........................ | G06N 3/045 |
| 2023/0124431 A1 * | 4/2023 | Bringoltz | ........... | G05B 13/0265 |

* cited by examiner

*Primary Examiner* — Ting Z Lee
(74) *Attorney, Agent, or Firm* — Lowenstein Sandler LLP

(57) ABSTRACT

An electronic device manufacturing system configured to receive, by a processor, input data reflecting a feature related to a manufacturing process of a substrate. The manufacturing system is further configured to train a machine-learning model based on the input data reflecting the feature. The manufacturing system is further configured to modify the machine-learning model in view of the virtual knob for the feature.

20 Claims, 6 Drawing Sheets understand # METHODS AND MECHANISMS FOR GENERATING VIRTUAL KNOBS FOR MODEL PERFORMANCE TUNING

TECHNICAL FIELD

The present disclosure relates to electrical components, and, more particularly, to methods and mechanisms for generating virtual knobs for model performance tuning.

BACKGROUND

Products can be produced by performing one or more manufacturing processes using manufacturing equipment. For example, semiconductor manufacturing equipment can be used to produce semiconductor devices (e.g., substrates) via semiconductor manufacturing processes. The manufacturing equipment can, according to a process recipe, deposit multiple layers of film on the surface of the substrate and can perform an etch process to form the intricate pattern in the deposited film. For example, the manufacturing equipment can perform a chemical vapor deposition (CVD) process to deposit alternative layers on the substrate. Sensors can be used to determine manufacturing parameters of the manufacturing equipment during the manufacturing processes and metrology equipment can be used to determine property data of the products that were produced by the manufacturing equipment, such as the overall thickness of the layers on the substrate. During the substrate manufacturing process, hardware variations in process chambers (e.g., different chuck temperatures, different lid temperatures, differences in the power delivery to each process chamber, differences in gas flow and/or pressure, etc.) or deteriorating conditions in the process chambers can cause the defects in the substrates (e.g., actual layer thickness deviating from expected layer thickness, uneven layer thickness, incomplete etching, etc.). Compensating for the deviations by adjusting the recipe using process chamber hardware settings is a time consuming and difficult process. Therefore, a system capable of virtually adjusting the parameters of the process chamber or adjusting the parameters of a recipe is desirable.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, an electronic device manufacturing system is configured to receive, by a processor, input data reflecting a feature related to a manufacturing process of a substrate. The manufacturing system is further configured to train a machine-learning model based on the input data reflecting the feature, and generate a virtual knob for the feature. The manufacturing system is further configured to modify the machine-learning model in view of the virtual knob for the feature.

A further aspect of the disclosure includes a method according to any aspect or embodiment described herein.

A further aspect of the disclosure includes a non-transitory computer-readable storage medium comprising instructions that, when executed by a processing device operatively coupled to a memory, performs operations according to any aspect or embodiment described herein.

BRIEF DESCRIPTION OF THE DRAWINGS

The present disclosure is illustrated by way of example, and not by way of limitation in the figures of the accompanying drawings.

DETAILED DESCRIPTION

Figure 1:
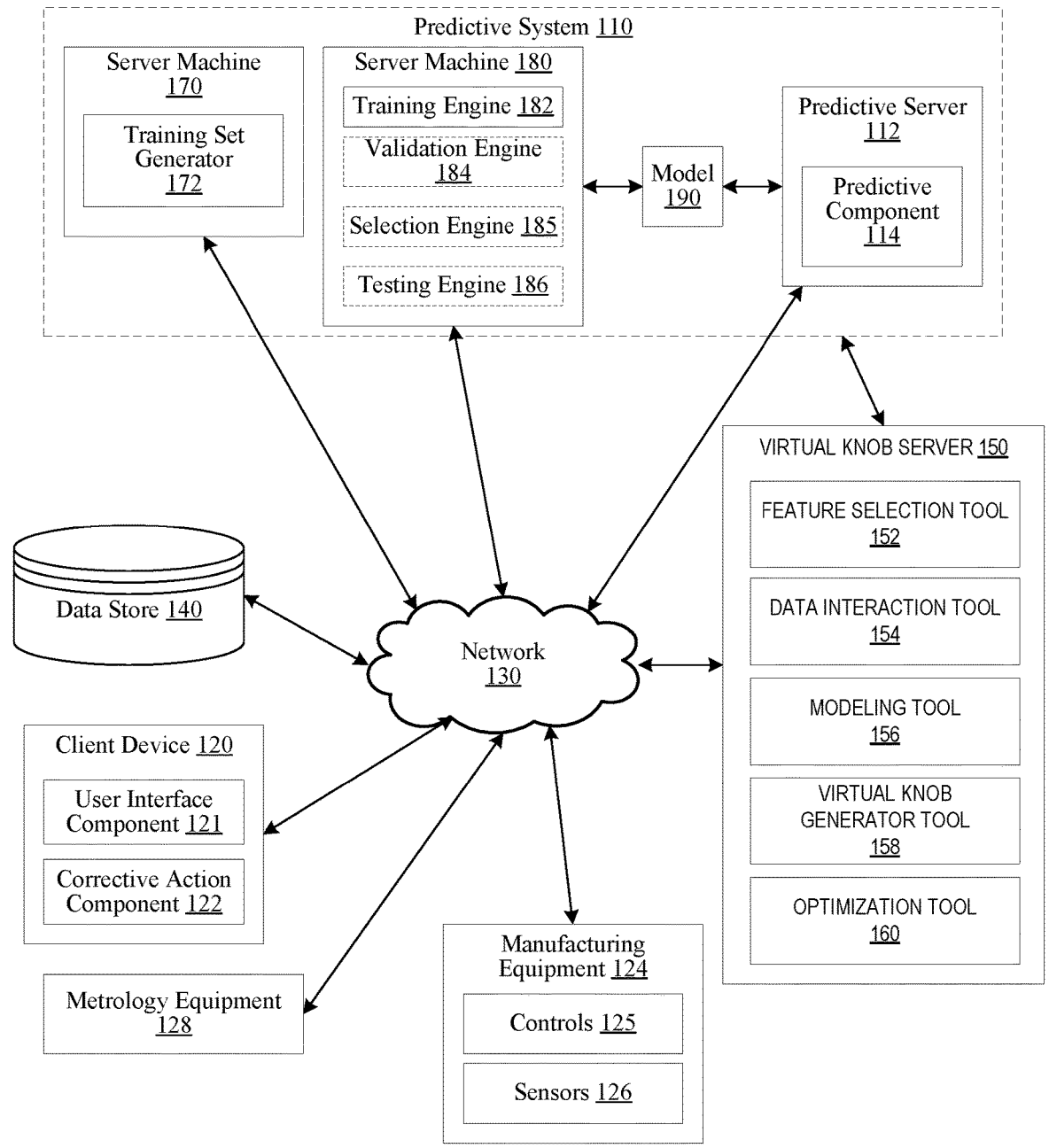
FIG. 1 is a block diagram illustrating an example system architecture, according to certain embodiments.

Described herein are technologies directed to methods and mechanisms for generating virtual knobs for model performance tuning. A film can be deposited on a surface of a substrate during a deposition process (e.g., a deposition (CVD) process, an atomic layer deposition (ALD) process, and so forth) performed at a process chamber of a manufacturing system. For example, in a CVD process, the substrate is exposed to one or more precursors, which react on the substrate surface to produce the desired deposit. The film can include one or more layers of materials that are formed during the deposition process, and each layer can include a particular thickness gradient (e.g., changes in the thickness along a layer of the deposited film). For example, a first layer can be formed directly on the surface of the substrate (referred to as a proximal layer or proximal end of the film) and have a first thickness. After the first layer is formed on the surface of the substrate, a second layer having a second thickness can be formed on the first layer. This process continues until the deposition process is completed and a final layer is formed for the film (referred to as the distal layer or distal end of the film). The film can include alternating layers of different materials. For example, the film can include alternating layers of oxide and nitride layers (oxide-nitride-oxide-nitride stack or ONON stack), alternating oxide and polysilicon layers (oxide-polysilicon-oxide-polysilicon stack or OPOP stack), and so forth.

The film can be subjected to, for example, an etch process to form a pattern on the surface of the substrate, a chemical-mechanical polishing/planarization (CMP) process to smooth the surface of the film, or any other process necessary to manufacture the finished substrate. An etch process can include exposing highly energetic process gas (e.g., a plasma) with a sample surface to break down the materials at the surface, which can then be removed by a vacuum system.

A process chamber can perform each substrate manufacturing process (e.g., the deposition process, the etch process, the polishing process, etc.) according to a process recipe. A process recipe defines a particular set of operations to be performed for the substrate during the process and can include one or more settings associated with each operation. For example, a deposition process recipe can include a temperature setting for the process chamber, a pressure setting for the process chamber, a flow rate setting for a precursor for a material included in the film deposited on the substrate surface, etc. Accordingly, the thickness of each film layer can be correlated to these process chamber settings.

A typical substrate processing method has multiple different processes, where each process can have a multitude of process control variables, also referred to as "knobs," that can be used to tune and optimize performance. Conventionally, a recipe for a processing method can be embodied as a table of recipe settings including a set of inputs or recipe parameters ("parameters") and processes that are manually entered by a user (e.g., process engineer) to achieve a set of target properties (e.g., on-wafer characteristics), also referred to as a set of goals. For example, the inputs can correspond to rows of the table and the processes can corresponds to the columns of the table. However, such manual population of parameters and/or processes can lead to recipes that are not optimized in view of multiple desired characteristics. For example, complex interrelationships may exist between desired characteristics, in which modifying the parameters and/or processes of the recipe to achieve a desired characteristic can have potentially unintended consequences on one or more other desired characteristics. Accordingly, a sub-optimal recipe can be created, which can produce defective substrates.

Aspects and implementations of the present disclosure address these and other shortcomings of the existing technology by training a machine-learning model capable of using virtual knobs to generate predictive data. A virtual knob can refer to a knob (a process control variable) that has not been used in actual substrate processing and is provided to adjust the output of the trained machine-learning model. In particular, a predictive system can train a machine-learning model for generating predictive data based on input data from one or more sensors and one or more virtual knobs. For example, the machine-learning model can be configured using the one or more virtual knobs and then process input sensor data such as reflectance data, temperature data, etc. to generate predictive data. In some embodiments, the predictive data can include thickness data of one or more deposition layers.

In some embodiments, the machine-learning model configured based one or more virtual knobs can be trained based on training data, which includes, for example, sensor data related to one or more features associated with performance of the manufacturing process mapped to metrology data (e.g., film thickness data). A feature can relate to any aspect of the manufacturing process that is regulated, monitored, controlled, or otherwise associated with one or more sets of sensors or controls. For example, a feature can include the gas flow, the chamber pressure, the control valve angle, the foreline pressure, the pump speed, the gas temperature, the chamber temperature, and so forth. The film thickness data can include measured thickness values obtained from measuring individual layers of material produced by the manufacturing equipment or measured thickness values obtained from measuring film stacks produced by the manufacturing equipment. In some embodiments, the film thickness data can be generated using reflectometry techniques, ellipsometry techniques, a TEM analysis, or any other measurement techniques. In some embodiments, the predictive model can be calibrated using measured metrology data.

The system of the present disclosure can then generate a virtual knob for each feature that is used to train the machine learning model. Each virtual knob can be capable of adjusting the representative value of the corresponding feature, thus adjusting the output generated by the machine-learning model. This allows the virtual knobs to control the performance of the machine-learning model by emulating the physical knobs of the manufacturing system. In particular, the virtual knobs can be representative of the physical knobs used to adjust process control variables of the manufacturing process. By using the virtual knobs, the values of the physical knob set of a particular processing recipe may remain unchanged, allowing a user to generate predictive data or virtually tune a process recipe without changing the physical settings associated with the actual recipe. Thus, responsive to receiving input data (e.g., current or historical sensor data), the machine-learning model can be configured to generate output data (e.g., predictive metrology data) reflective of different virtual knob settings. In some embodiments, a corrective action component can be used to adjust a recipe based on the virtual knobs settings. For example, it may be determined that certain recipe adjustments, based on the virtual knob settings, are desirable. Accordingly, the corrective action component can adjust the recipe values (e.g., physical knob settings, recipe table values, etc.) based on the virtual knob values. This allows the manufacturing system to generate adjustments for the manufacturing of subsequent substrates.

Aspects of the present disclosure result in technological advantages of significant reduction in time and data required to adjust the parameters of a machine-learning model capable of generating predictive metrology data. In particular, rather than retraining a machine-learning model with different parameters, aspect so the present disclosure allow for a trained machine-learning model to be adjusted using virtual knobs. The present disclosure can also result in generating predictive data and performing corrective actions to avoid inconsistent and abnormal products, and unscheduled user time or down time.

FIG. 1 depicts an illustrative computer system architecture 100, according to aspects of the present disclosure. In some embodiments, computer system architecture 100 can be included as part of a manufacturing system for processing substrates, such as manufacturing system 300 of FIG. 3. Computer system architecture 100 includes a client device 120, manufacturing equipment 124, metrology equipment 128, predictive server 112 (e.g., to generate predictive data, to provide model adaptation, to use a knowledge base, etc.), data store 140, and virtual knob server 150. The predictive server 112 can be part of a predictive system 110. The predictive system 110 can further include server machines 170 and 180. The manufacturing equipment 124 can include sensors 126 configured to capture data for a substrate being processed at the manufacturing system. In some embodiments, the manufacturing equipment 124 and sensors 126 can be part of a sensor system that includes a sensor server (e.g., field service server (FSS) at a manufacturing facility) and sensor identifier reader (e.g., front opening unified pod (FOUP) radio frequency identification (RFID) reader for sensor system). In some embodiments, metrology equipment 128 can be part of a metrology system that includes a metrology server (e.g., a metrology database, metrology folders, etc.) and metrology identifier reader (e.g., FOUP RFID reader for metrology system).

Manufacturing equipment 124 can produce products, such as electronic devices, following a recipe or performing runs over a period of time. Manufacturing equipment 124 can include a process chamber. Manufacturing equipment 124 can perform a process for a substrate (e.g., a wafer, etc.) at the process chamber. Examples of substrate processes include a deposition process to deposit one or more layers of film on a surface of the substrate, an etch process to form a pattern on the surface of the substrate, etc. Manufacturing equipment 124 can perform each process according to a process recipe. A process recipe defines a particular set of operations to be performed for the substrate during the process and can include one or more settings associated with each operation. For example, a deposition process recipe can include a temperature setting for the process chamber, a pressure setting for the process chamber, a flow rate setting for a precursor for a material included in the film deposited on the substrate surface, etc.

In some embodiments, manufacturing equipment 124 includes sensors 126 that are configured to generate data associated with a substrate processed at manufacturing system 100. For example, a process chamber can include one or more sensors configured to generate spectral or non-spectral data associated with the substrate before, during, and/or after a process (e.g., a deposition process) is performed for the substrate. In some embodiments, spectral data generated by sensors 126 can indicate a concentration of one or more materials deposited on a surface of a substrate. Sensors 126 configured to generate spectral data associated with a substrate can include reflectometry sensors, ellipsometry sensors, thermal spectra sensors, capacitive sensors, and so forth. Sensors 126 configured to generate non-spectral data associated with a substrate can include temperature sensors, pressure sensors, flow rate sensors, voltage sensors, etc. Further details regarding manufacturing equipment 124 are provided with respect to FIG. 3.

In some embodiments, sensors 126 provide sensor data (e.g., sensor values, features, trace data) associated with manufacturing equipment 124 (e.g., associated with producing, by manufacturing equipment 124, corresponding products, such as wafers). The manufacturing equipment 124 can produce products following a recipe or by performing runs over a period of time. Sensor data received over a period of time (e.g., corresponding to at least part of a recipe or run) can be referred to as trace data (e.g., historical trace data, current trace data, etc.) received from different sensors 126 over time. Sensor data can include a value of one or more of temperature (e.g., heater temperature), spacing (SP), pressure, high frequency radio frequency (HFRF), voltage of electrostatic chuck (ESC), electrical current, material flow, power, voltage, etc. Sensor data can be associated with or indicative of manufacturing parameters such as hardware parameters, such as settings or components (e.g., size, type, etc.) of the manufacturing equipment 124, or process parameters of the manufacturing equipment 124. The sensor data can be provided while the manufacturing equipment 124 is performing manufacturing processes (e.g., equipment readings when processing products). The sensor data can be different for each substrate.

In some embodiments, manufacturing equipment 124 can include controls 125. Controls 125 can include one or more components or sub-systems configured to enable and/or control one or more processes of manufacturing equipment 124. For example, a sub-system can include a pressure sub-system, a flow sub-system, a temperature subsystem and so forth, each sub-system having one or more components. The component can include, for example, a pressure pump, a vacuum, a gas deliver line, a plasma etcher, actuators etc. In some embodiments, controls 125 can be managed based on data from sensors 126, input from control device 120, etc.

Metrology equipment 128 can provide metrology data associated with substrates processed by manufacturing equipment 124. The metrology data can include a value of film property data (e.g., wafer spatial film properties), dimensions (e.g., thickness, height, etc.), dielectric constant, dopant concentration, density, defects, etc. In some embodiments, the metrology data can further include a value of one or more surface profile property data (e.g., an etch rate, an etch rate uniformity, a critical dimension of one or more features included on a surface of the substrate, a critical dimension uniformity across the surface of the substrate, an edge placement error, etc.). The metrology data can be of a finished or semi-finished product. The metrology data can be different for each substrate. Metrology data can be generated using, for example, reflectometry techniques, ellipsometry techniques, TEM techniques, and so forth.

Reflectometry techniques can include time-domain reflectometry (TDR), frequency-domain reflectometry (FDR), ellipsometry, etc. TDF emits a series of fast pulses, and analyzes the magnitude, duration and shape of the reflected pulses. FDR is based on the transmission of a set of stepped-frequency sine waves from the sample. The signal analysis is focused on the changes in frequency between the incident signal and the reflected signal. Ellipsometry includes the polarization-resolved measurement of light reflections from films. As will be explained in greater detail within, the reflectometry techniques can be used to obtain sensor data (e.g., a reflectance value(s)), which can be processed to generate metrology data.

In some embodiments, metrology equipment 128 can be included as part of the manufacturing equipment 124. For example, metrology equipment 128 can be included inside of or coupled to a process chamber and configured to generate metrology data for a substrate before, during, and/or after a process (e.g., a deposition process, an etch process, etc.) while the substrate remains in the process chamber. In some instances, metrology equipment 128 can be referred to as in-situ metrology equipment. In another example, metrology equipment 127 can be coupled to another station of manufacturing equipment 124. For example, metrology equipment can be coupled to a transfer chamber, such as transfer chamber 310 of FIG. 3, a load lock, such as load lock 320, or a factory interface, such as factory interface 306.

The client device 120 can include a computing device such as personal computers (PCs), laptops, mobile phones, smart phones, tablet computers, netbook computers, network connected televisions ("smart TVs"), network-connected media players (e.g., Blu-ray player), a set-top box, over-the-top (OTT) streaming devices, operator boxes, etc. In some embodiments, the metrology data can be received from the client device 120. Client device 120 can display a graphical user interface (GUI), where the GUI enables the user to provide, as input, metrology measurement values for substrates processed at the manufacturing system. The client device 120 can include user interface (UI) component 121 and corrective action component 122. UI component 121 can receive user input (e.g., via a Graphical User Interface (GUI) displayed via the client device 120) associate with generating a machine-learning model, generating one or more virtual knobs, etc. In some embodiments, the input data can be sent to or processed by virtual knob server 150. Corrective action component 122 can receive user input (e.g., via a Graphical User Interface (GUI) displayed via the client device 120) of an indication associated with manufacturing equipment 124. In some embodiments, the corrective action component 122 transmits the indication to the predictive system 110, receives output (e.g., predictive data) from the predictive system 110, determines a corrective action based on the output, and causes the corrective action to be implemented. In some embodiments, the corrective action component 122 receives an indication of a corrective action from the predictive system 110 and causes the corrective action to be implemented. Each client device 120 can include an operating system that allows users to one or more of generate, view, or edit data (e.g., indication associated with manufacturing equipment 124, corrective actions associated with manufacturing equipment 124, etc.).

Data store 140 can be a memory (e.g., random access memory), a drive (e.g., a hard drive, a flash drive), a database system, or another type of component or device capable of storing data. Data store 140 can include multiple storage components (e.g., multiple drives or multiple databases) that can span multiple computing devices (e.g., multiple server computers). The data store 140 can store data associated with processing a substrate at manufacturing equipment 124. For example, data store 140 can store data collected by sensors 126 at manufacturing equipment 124 before, during, or after a substrate process (referred to as process data). Process data can refer to historical process data (e.g., process data generated for a prior substrate processed at the manufacturing system) and/or current process data (e.g., process data generated for a current substrate processed at the manufacturing system). Data store can also store spectral data or non-spectral data associated with a portion of a substrate processed at manufacturing equipment 124. Spectral data can include historical spectral data and/or current spectral data.

Data store 140 can also store contextual data associated with one or more substrates processed at the manufacturing system. Contextual data can include a recipe name, recipe step number, preventive maintenance indicator, operator, etc. Contextual data can refer to historical contextual data (e.g., contextual data associated with a prior process performed for a prior substrate) and/or current process data (e.g., contextual data associated with current process or a future process to be performed for a prior substrate). The contextual data can further include identify sensors that are associated with a particular sub-system of a process chamber.

Data store 140 can also store task data. Task data can include one or more sets of operations to be performed for the substrate during a deposition process and can include one or more settings associated with each operation. For example, task data for a deposition process can include a temperature setting for a process chamber, a pressure setting for a process chamber, a flow rate setting for a precursor for a material of a film deposited on a substrate, etc. In another example, task data can include controlling pressure at a defined pressure point for the flow value. Task data can refer to historical task data (e.g., task data associated with a prior process performed for a prior substrate) and/or current task data (e.g., task data associated with current process or a future process to be performed for a substrate).

In some embodiments, data store 140 can also store film thickness data (e.g., a film thickness profile) associated with one or more film layers. A film thickness profile refers to a particular thickness gradient of deposited film (e.g., changes in the thickness along a layer of deposited film). In some embodiments, the film thickness profile can include a thickness value of a film stack (e.g., multiple layers of one or more materials) deposited on a surface of a substrate (e.g., as determined by metrology inspection or as determined by prediction using, for example, a physics engine). For example, the film thickness profile can include a thickness value(s) of an ONON stack, an OPOP stack, an aggregated stack (e.g., an aggregated oxide stack, an aggregated nitride stack, an aggregated polysilicon stack etc.), or any other film stack generated by the manufacturing equipment 124 or by a simulation model. An aggregated stack can include thickness data associated with layers of a single material from a film stack having multiple layers of different materials. For example, from an ONON stack, an aggregated oxide stack can include thickness data from only the oxide layers, and an aggregated nitride stack can include thickness data from only the nitride layers.

In some embodiments, data store 140 can be configured to store data that is not accessible to a user of the manufacturing system. For example, process data, spectral data, contextual data, etc. obtained for a substrate being processed at the manufacturing system is not accessible to a user (e.g., an operator) of the manufacturing system. In some embodiments, all data stored at data store 140 can be inaccessible by the user of the manufacturing system. In other or similar embodiments, a portion of data stored at data store 140 can be inaccessible by the user while another portion of data stored at data store 140 can be accessible by the user. In some embodiments, one or more portions of data stored at data store 140 can be encrypted using an encryption mechanism that is unknown to the user (e.g., data is encrypted using a private encryption key). In other or similar embodiments, data store 140 can include multiple data stores where data that is inaccessible to the user is stored in one or more first data stores and data that is accessible to the user is stored in one or more second data stores.

In some embodiments, data store 140 can be configured to store data associated with known fault patterns. A fault pattern can be a one or more values (e.g., a vector, a scalar, etc.) associated with one or more issues or failures associated with a process chamber sub-system. In some embodiments, a fault pattern can be associated with a corrective action. For example, a fault pattern can include parameter adjustment steps to correct the issue or failure indicated by the fault pattern. For example, the predictive system can compare a determined fault pattern to a library of known fault patterns to determine the type of failure experienced by a sub-system, the cause of the failure, the recommended corrective action to correct the fault, and so forth.

In some embodiments, virtual knob server 150 can be configured to generate one or more virtual knobs capable of controlling the performance of a machine-learning model and/or capable of controlling the performance of one or more features of manufacturing equipment 124 (via the corrective action component 122). Virtual knob server 150 can include one or more computing devices such as a rackmount server, a router computer, a server computer, a personal computer, a mainframe computer, a laptop computer, a tablet computer, a desktop computer, a GPU, an ASIC, etc. Virtual knob server 150 can include a data storage device (e.g., one or more disk drives and/or solid state drives), a main memory, a static memory, a network interface, and/or other components. Virtual knob server 150 can execute instructions to perform any one or more of the methodologies and/or embodiments described herein. In some embodiments, virtual knob server 150 can adjust the performance of one or more features of a machine-learning model (e.g., model 190). In some embodiments, virtual knob server 150 can execute instructions to control one or more operations at manufacturing equipment 124 in accordance with a received input (e.g., a user input, a corrective action command, etc.). The instructions can be stored on a computer readable storage medium, which can include the main memory, static memory, secondary storage and/or processing device (during execution of the instructions).

Virtual knob server 150 can include feature selection tool 152, data interaction tool 154, modeling tool 156, virtual knob generator tool 158, and optimization tool 160.

Feature selection tool 152 enables virtual knob server 150 to select one or more features associated with performing the manufacturing process. In particular, a feature can relate to any aspect of the manufacturing process that is regulated, monitored, controlled, or otherwise associated with one or more sets of sensors or controls. For example, a feature can include the gas flow, the chamber pressure, the control valve angle, the foreline pressure, the pump speed, the gas temperature, the chamber temperature, and so forth. The feature(s) can be selected using, for example, user interface (UI) component 121 of client device 120. For example, UI component 121 can display a list of features for selection, which may be selected using user input. In some embodiments, based on the selected feature, feature selection tool 152 can select training data related to the feature. The training data can include sensor data, metrology data, or any other data associated with the feature. The training data can be used to train a machine-learning model, as will be described in detail below.

In some embodiments, the features can be selected automatically. The automatic selection can be based on a recipe, a chamber sub-system selection, etc. For example, based on user input, a process chamber sub-system can be selected (e.g., a pressure sub-system, a flow sub-system, a temperature subsystem). Responsive to this selection, feature selection tool 152 can perform a look up in a data structure and select one or more features related to the selected subsystem.

Data interaction tool 154 can perform one or more preprocessing operations on the received input data. In some embodiments, the preprocessing operations can include a smoothing operation, a normalization operation, a dimensions reduction operations, a sort features operation, or any other operation configured to prepare data for training a machine-learning model. A smoothing operation can include modifying one or more data points of a signal so that individual points higher than adjacent points (which may be higher due to, for example, noise) are reduced, and data points that are lower than the adjacent points are increased. The smoothing operation may generate a smoother signal. A normalization operation can bring the numerical data to a common or balanced scale without distorting the data. A dimension reduction operation refers to one or more techniques for reducing the number of input variables in training data. This allows for reducing the dimensionality by projecting the data to a lower dimensional subspace while capturing the significance of the data. The sort features operation can include ranking the selected feature based on an order of importance.

Modeling tool 156 can be send the input data and/or preprocessed data to predictive system 110 to generate a machine-learning model 190. For example, modeling tool 156 can send the input data and/or preprocessed data to server machine 170, and instruct server machine 170 to generate one or more training sets using training set generator 172, which can be used by server machine 180 to generate machine-learning model 190. The machine-learning model can include a representative function for each selected feature. In an illustrative example, machine-learning model 190 can be trained using linear regression, and expressed as seen in Formula 1 below, where the x value(s) represent each selected feature, the c value(s) represent corresponding coefficients, and the Po value represents the intercept value, and y represents the label value:

$$y = \beta_0 + c_1 x_1 + c_2 x_2 + c_3 x_3 + \quad \text{Formula 1}$$

Details regarding training a machine-learning model are discussed below with reference to predictive system 110.

Virtual knob generator tool 158 can generate a virtual knob for each selected feature used to train the machine-learning model. Each virtual knob can be capable of adjusting the representative value of the corresponding feature, thus adjusting the output of the machine-learning model. This allows the virtual knobs to control the performance of the machine-learning model. In some embodiments, to generate a virtual knob, processing logic can use a transform function (or any other applicable function) to modify one or more values representing each feature in the machine-learning model. In some embodiments, the virtual knobs can be representative of physical knobs used to adjust process control variables of the manufacturing process. By using the virtual knobs, the values of physical knobs set of a particular processing recipe may remain unchanged, allowing a user to generate predicative data or virtually tune a process recipe without changing the physical settings associated with the actual recipe. In an illustrative example, using Formula 1 as the machine-learning model, the virtual knobs may be expressed as seen in Formula 2 below, where the k value(s) represent an virtual knob value, and the w value(s) represent a scaling constant (e.g., a scaling vector):

$$y = \beta_0 + c_1(x_1 + k_1 w_1) + c_2(x_2 + k_2 w_2) + c_3(x_3 + k_3 w_3) + \quad \text{Formula 2}$$

The scaling constant can be configured to increase or decrease the adjustment factor of the virtual knob. This allows for calibrating the virtual knobs without needing to retrain the machine-learning model. The scaling constant can be generated manually (e.g., user input), or automatically (e.g., based on a predefined value associated with a particular feature) using, for example, a data table, optimization tool 160, etc.

Optimization tool 160 can perform an optimization operation to adjust the virtual knob values and/or the scaling constant values. An optimization operation can be used to adjust the values of the knob values and/or the scaling constant values. In some embodiments, virtual knob values and/or the scaling constant values can be adjusted using, for example the Nelder-Mead method, or any other optimization operation. The Melder-Mead method is based on evaluating a function at the vertices of a simplex (e.g., a generalization of the notion of a triangle or tetrahedron to arbitrary dimensions), then iteratively shrinking the simplex as better points are found until some desired bound is obtained. In one example, optimization tool 160 can adjust the virtual knob values and/or the scaling constant values to account for chamber matching. Chamber matching can be used to minimize process variation between substrates due to hardware variations. For example, the hardware variations can include different chuck temperatures, different lid temperatures, differences in the power delivery to each process chamber, differences in gas flow and/or pressure, etc. A chamber matching operation can include adjusting one or more parameters of the second process chamber or adjusting one or more parameters of a recipe used to generate a substrate in the second process chamber. Thus, optimization tool 160 can perform chamber matching by adjusting one or more virtual knob values and/or one or more scaling constant values.

In some embodiments, predictive system 110 includes predictive server 112, server machine 170 and server machine 180. The predictive server 112, server machine 170, and server machine 180 can each include one or more computing devices such as a rackmount server, a router computer, a server computer, a personal computer, a mainframe computer, a laptop computer, a tablet computer, a desktop computer, Graphics Processing Unit (GPU), accelerator Application-Specific Integrated Circuit (ASIC) (e.g., Tensor Processing Unit (TPU)), etc.

Server machine 170 includes a training set generator 172 that is capable of generating training data sets (e.g., a set of data inputs and a set of target outputs) to train, validate, and/or test a machine-learning model 190. Machine-learning model 190 can be any algorithmic model capable of learning from data. In some embodiments, machine-learning model 190 can be a predictive model. In some embodiments, the data set generator 172 can partition the training data into a training set, a validating set, and a testing set. In some embodiments, the predictive system 110 generates multiple sets of training data.

Server machine 180 can include a training engine 182, a validation engine 184, a selection engine 185, and/or a testing engine 186. An engine can refer to hardware (e.g., circuitry, dedicated logic, programmable logic, microcode, processing device, etc.), software (such as instructions run on a processing device, a general purpose computer system, or a dedicated machine), firmware, microcode, or a combination thereof. Training engine 182 can be capable of training one or more machine-learning model 190. Machine-learning model 190 can refer to the model artifact that is created by the training engine 182 using the training data (also referred to herein as a training set) that includes training inputs and corresponding target outputs (correct answers for respective training inputs). The training engine 182 can find patterns in the training data that map the training input to the target output (the answer to be predicted), and provide the machine-learning model 190 that captures these patterns. The machine-learning model 190 can use one or more of a statistical modelling, support vector machine (SVM), Radial Basis Function (RBF), clustering, supervised machine-learning, semi-supervised machine-learning, unsupervised machine-learning, k-nearest neighbor algorithm (k-NN), linear regression, random forest, neural network (e.g., artificial neural network), etc.

One type of machine learning model that can be used to perform some or all of the above tasks is an artificial neural network, such as a deep neural network. Artificial neural networks generally include a feature representation component with a classifier or regression layers that map features to a desired output space. A convolutional neural network (CNN), for example, hosts multiple layers of convolutional filters. Pooling is performed, and non-linearities can be addressed, at lower layers, on top of which a multi-layer perceptron is commonly appended, mapping top layer features extracted by the convolutional layers to decisions (e.g. classification outputs). Deep learning is a class of machine learning algorithms that use a cascade of multiple layers of nonlinear processing units for feature extraction and transformation. Each successive layer uses the output from the previous layer as input. Deep neural networks can learn in a supervised (e.g., classification) and/or unsupervised (e.g., pattern analysis) manner. Deep neural networks include a hierarchy of layers, where the different layers learn different levels of representations that correspond to different levels of abstraction. In deep learning, each level learns to transform its input data into a slightly more abstract and composite representation. In a plasma process tuning, for example, the raw input can be process result profiles (e.g., thickness profiles indicative of one or more thickness values across a surface of a substrate); the second layer can compose feature data associated with a status of one or more zones of controlled elements of a plasma process system (e.g., orientation of zones, plasma exposure duration, etc.); the third layer can include a starting recipe (e.g., a recipe used as a starting point for determining an updated process recipe the process a substrate to generate a process result the meets threshold criteria). Notably, a deep learning process can learn which features to optimally place in which level on its own. The "deep" in "deep learning" refers to the number of layers through which the data is transformed. More precisely, deep learning systems have a substantial credit assignment path (CAP) depth. The CAP is the chain of transformations from input to output. CAPs describe potentially causal connections between input and output. For a feedforward neural network, the depth of the CAPs can be that of the network and can be the number of hidden layers plus one. For recurrent neural networks, in which a signal can propagate through a layer more than once, the CAP depth is potentially unlimited.

In one embodiment, one or more machine-learning model is a recurrent neural network (RNN). An RNN is a type of neural network that includes a memory to enable the neural network to capture temporal dependencies. An RNN is able to learn input-output mappings that depend on both a current input and past inputs. The RNN will address past and future flow rate measurements and make predictions based on this continuous metrology information. RNNs can be trained using a training dataset to generate a fixed number of outputs (e.g., to determine a set of substrate processing rates, determine modification to a substrate process recipe). One type of RNN that can be used is a long short term memory (LSTM) neural network.

Training of a neural network can be achieved in a supervised learning manner, which involves feeding a training dataset consisting of labeled inputs through the network, observing its outputs, defining an error (by measuring the difference between the outputs and the label values), and using techniques such as deep gradient descent and back-propagation to tune the weights of the network across all its layers and nodes such that the error is minimized. In many applications, repeating this process across the many labeled inputs in the training dataset yields a network that can produce correct output when presented with inputs that are different than the ones present in the training dataset.

A training dataset containing hundreds, thousands, tens of thousands, hundreds of thousands or more sensor data and/or process result data (e.g., metrology data such as one or more thickness profiles associated with the sensor data) can be used to form a training dataset.

To effectuate training, processing logic can input the training dataset(s) into one or more untrained machine learning models. Prior to inputting a first input into a machine learning model, the machine learning model can be initialized. Processing logic trains the untrained machine learning model(s) based on the training dataset(s) to generate one or more trained machine learning models that perform various operations as set forth above. Training can be performed by inputting one or more of the sensor data into the machine learning model one at a time.

The machine-learning model processes the input to generate an output. An artificial neural network includes an input layer that consists of values in a data point. The next layer is called a hidden layer, and nodes at the hidden layer each receive one or more of the input values. Each node contains parameters (e.g., weights) to apply to the input values. Each node therefore essentially inputs the input values into a multivariate function (e.g., a non-linear mathematical transformation) to produce an output value. A next layer can be another hidden layer or an output layer. In either case, the nodes at the next layer receive the output values from the nodes at the previous layer, and each node applies weights to those values and then generates its own output value. This can be performed at each layer. A final layer is the output layer, where there is one node for each class, prediction and/or output that the machine-learning model can produce.

Accordingly, the output can include one or more predictions or inferences. For example, an output prediction or inference can include one or more predictions of film buildup on chamber components, erosion of chamber components, predicted failure of chamber components, and so on. Processing logic determines an error (i.e., a classification error) based on the differences between the output (e.g., predictions or inferences) of the machine learning model and target labels associated with the input training data. Processing logic adjusts weights of one or more nodes in the machine-learning model based on the error. An error term or delta can be determined for each node in the artificial neural network. Based on this error, the artificial neural network adjusts one or more of its parameters for one or more of its nodes (the weights for one or more inputs of a node). Parameters can be updated in a back propagation manner, such that nodes at a highest layer are updated first, followed by nodes at a next layer, and so on. An artificial neural network contains multiple layers of "neurons", where each layer receives as input values from neurons at a previous layer. The parameters for each neuron include weights associated with the values that are received from each of the neurons at a previous layer. Accordingly, adjusting the parameters can include adjusting the weights assigned to each of the inputs for one or more neurons at one or more layers in the artificial neural network.

After one or more rounds of training, processing logic can determine whether a stopping criterion has been met. A stopping criterion can be a target level of accuracy, a target number of processed images from the training dataset, a target amount of change to parameters over one or more previous data points, a combination thereof and/or other criteria. In one embodiment, the stopping criteria is met when at least a minimum number of data points have been processed and at least a threshold accuracy is achieved. The threshold accuracy can be, for example, 70%, 80% or 90% accuracy. In one embodiment, the stopping criterion is met if accuracy of the machine-learning model has stopped improving. If the stopping criterion has not been met, further training is performed. If the stopping criterion has been met, training can be complete. Once the machine-learning model is trained, a reserved portion of the training dataset can be used to test the model.

Once one or more trained machine learning models 190 are generated, they can be stored in predictive server 112 as predictive component 114 or as a component of predictive component 114.

The validation engine 184 can be capable of validating machine-learning model 190 using a corresponding set of features of a validation set from training set generator 172. Once the model parameters have been optimized, model validation can be performed to determine whether the model has improved and to determine a current accuracy of the deep learning model. The validation engine 184 can determine an accuracy of machine-learning model 190 based on the corresponding sets of features of the validation set. The validation engine 184 can discard a trained machine-learning model 190 that has an accuracy that does not meet a threshold accuracy. In some embodiments, the selection engine 185 can be capable of selecting a trained machine-learning model 190 that has an accuracy that meets a threshold accuracy. In some embodiments, the selection engine 185 can be capable of selecting the trained machine-learning model 190 that has the highest accuracy of the trained machine-learning models 190.

The testing engine 186 can be capable of testing a trained machine-learning model 190 using a corresponding set of features of a testing set from data set generator 172. For example, a first trained machine-learning model 190 that was trained using a first set of features of the training set can be tested using the first set of features of the testing set. The testing engine 186 can determine a trained machine-learning model 190 that has the highest accuracy of all of the trained machine-learning models based on the testing sets.

As described in detail below, predictive server 112 includes a predictive component 114 that is capable of providing data indicative of the expected behavior of each sub-system of a process chamber, and running trained machine-learning model 190 on the current sensor data input to obtain one or more outputs. The predictive server 112 can further provide data indicative of the health of the process chamber sub-system and diagnostics. This will be explained in further detail below.

The client device 120, manufacturing equipment 124, sensors 126, metrology equipment 128, predictive server 112, data store 140, server machine 170, and server machine 180 can be coupled to each other via a network 130. In some embodiments, network 130 is a public network that provides client device 120 with access to predictive server 112, data store 140, and other publically available computing devices. In some embodiments, network 130 is a private network that provides client device 120 access to manufacturing equipment 124, metrology equipment 128, data store 140, and other privately available computing devices. Network 130 can include one or more wide area networks (WANs), local area networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

It should be noted that in some other implementations, the functions of server machines 170 and 180, as well as predictive server 112, can be provided by a fewer number of machines. For example, in some embodiments, server machines 170 and 180 can be integrated into a single machine, while in some other or similar embodiments, server machines 170 and 180, as well as predictive server 112, can be integrated into a single machine.

In general, functions described in one implementation as being performed by server machine 170, server machine 180, and/or predictive server 112 can also be performed on client device 120. In addition, the functionality attributed to a particular component can be performed by different or multiple components operating together.

In embodiments, a "user" can be represented as a single individual. However, other embodiments of the disclosure encompass a "user" being an entity controlled by a plurality of users and/or an automated source. For example, a set of individual users federated as a group of administrators can be considered a "user."

Figure 2:
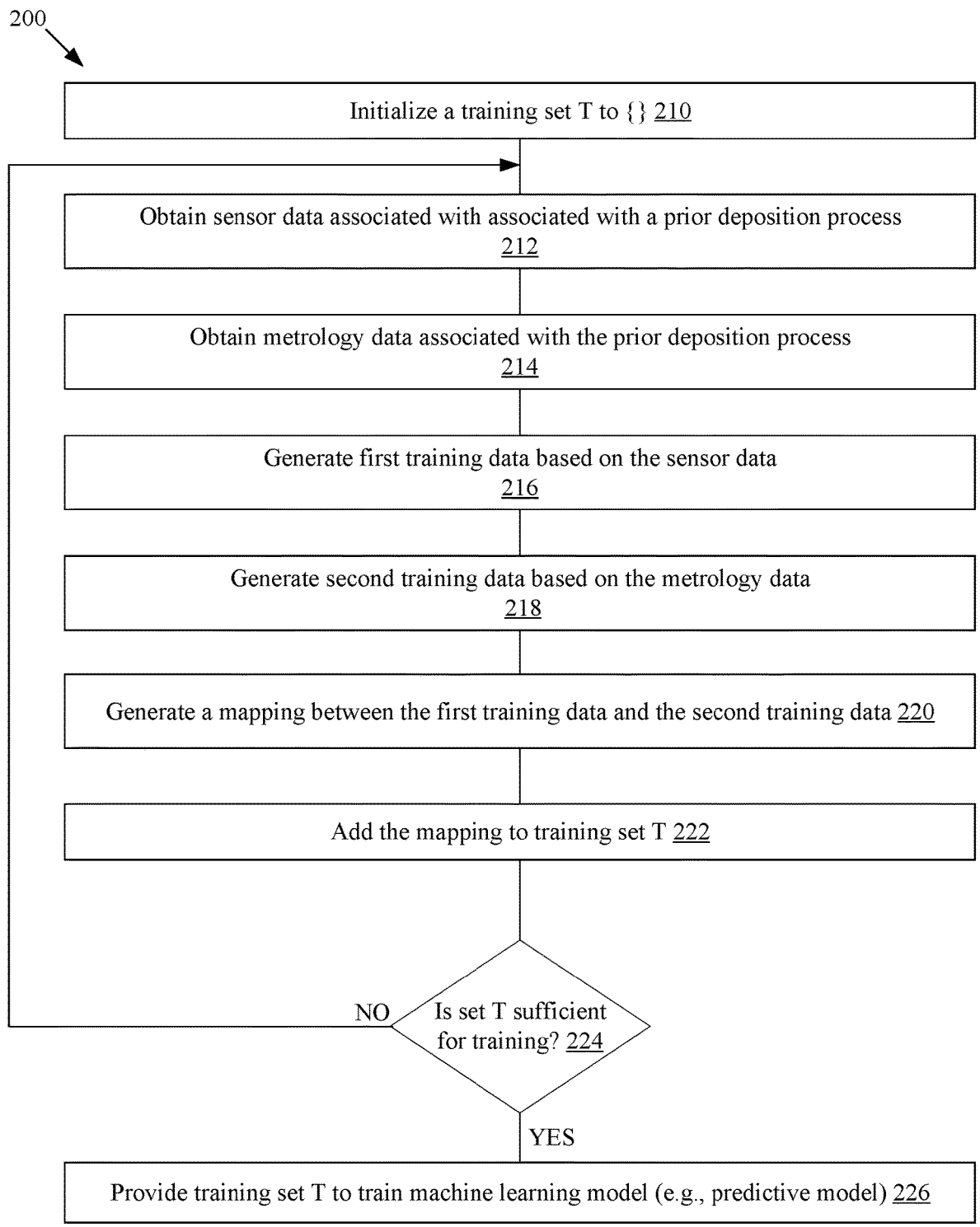
FIG. 2 is a flow diagram of a method for training a machine-learning model, according to certain embodiments.

FIG. 2 is a flow chart of a method 200 for training a machine-learning model, according to aspects of the present disclosure. Method 200 is performed by processing logic that can include hardware (circuitry, dedicated logic, etc.), software (such as is run on a general purpose computer system or a dedicated machine), firmware, or some combination thereof. In one implementation, method 200 can be performed by a computer system, such as computer system architecture 100 of FIG. 1. In other or similar implementations, one or more operations of method 200 can be performed by one or more other machines not depicted in the figures. In some aspects, one or more operations of method 200 can be performed by server machine 170, server machine 180, and/or predictive server 112.

For simplicity of explanation, the methods are depicted and described as a series of acts. However, acts in accordance with this disclosure can occur in various orders and/or concurrently, and with other acts not presented and described herein. Furthermore, not all illustrated acts can be performed to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term article of manufacture, as used herein, is intended to encompass a computer program accessible from any computer-readable device or storage media.

At operation 210, processing logic initializes a training set T to an empty set (e.g., { }).

At operation 212, processing logic obtains sensor data (e.g., sensor values, features, trace data) associated with a prior deposition process performed to deposit one or more layers of film on a surface of a prior substrate. In some embodiments, the sensor data can be related to one or more features selected using feature selection tool 152. In some embodiments, the sensor data associated with the deposition process is historical data associated with one or more prior deposition settings for a prior deposition process previously performed for a prior substrate at a manufacturing system. For example, the historical data can be historical contextual data associated with the prior deposition process stored at data store 140. In some embodiments, the one or more prior deposition settings can include at least one of a prior temperature setting for the prior deposition process, a prior pressure setting for the prior deposition setting, a prior flow rate setting for a precursor for one or more material of the prior film deposited on the surface of the prior substrate, or any other setting associated with the deposition process. A flow rate setting can refer to a flow rate setting for the precursor at an initial instance of the prior deposition process (referred to as an initial flow rate setting), a flow rate setting for the precursor at a final instance of the prior deposition process (referred to as a final flow rate setting), or a ramping rate for the flow rate of the precursor during the deposition process. In one example, the precursor for the prior film can include a boron-containing precursor or a silicon-containing precursor.

At operation 214, processing logic obtains metrology data (e.g., film property data) associated with the one or more film layers. The film property data can include spatial film properties, dimensions (e.g., thickness, height, etc.), dielectric constant, dopant concentration, density, defects, etc. In some embodiments, the film property data can include a film thickness profile associated with one or more film layers. Processing logic can obtain the film property data from data store 140, in accordance with previously described embodiments. In some embodiments, processing logic can generate using a physics engine, a simulation model, or any other system capable of generating film property data for one or more film layers.

At operation 216, processing logic generates first training data based on the sensor data obtained at operation 212. At operation 218, processing logic generates second training data based on the film property data obtained at operation 214.

At operation 220, processing logic generates a mapping between the first training data and the second training data. The mapping refers to the first training data that includes or is based on data for the sensor data (e.g., reflectance data, temperature data, etc.) and the second training data that includes or is based on film property data (e.g., thickness data), where the first training data is associated with (or mapped to) the second training data. At operation 222, processing logic adds the mapping to the training set T.

At operation 224, processing logic determines whether the training set, T, includes a sufficient amount of training data to train a machine-learning model (e.g., predictive model 190). It should be noted that in some implementations, the sufficiency of training set T can be determined based simply on the number of mappings in the training set, while in some other implementations, the sufficiency of training set T can be determined based on one or more other criteria (e.g., a measure of diversity of the training examples, etc.) in addition to, or instead of, the number of input/output mappings. Responsive to determining the training set does not include a sufficient amount of training data to train the machine-learning model, method 200 returns to operation 212. Responsive to determining the training set T includes a sufficient amount of training data to train the machine-learning model, method 200 continues to operation 226.

At operation 226, processing logic provides the training set T to train the machine-learning model. In one implementation, the training set T is provided to training engine 182 of server machine 180 to perform the training. In the case of a neural network, for example, input values of a given input/output mapping are input to the neural network, and output values of the input/output mapping are stored in the output nodes of the neural network. The connection weights in the neural network are then adjusted in accordance with a learning algorithm (e.g., backpropagation, etc.), and the procedure is repeated for the other input/output mappings in the training set T.

In some embodiments, the processing logic can perform outlier detection methods to remove anomalies from the training set T prior to training the machine-learning model. Outlier detection methods can include techniques that identify values that differ significantly from the majority the training data. These values can be generated from errors, noise, etc.

After operation 226, the predictive model can receive, as input, sensor data and generate predictive data. In some embodiments, the predictive data can include thickness data or a thickness profile of one or more deposition layers.

Figure 3:
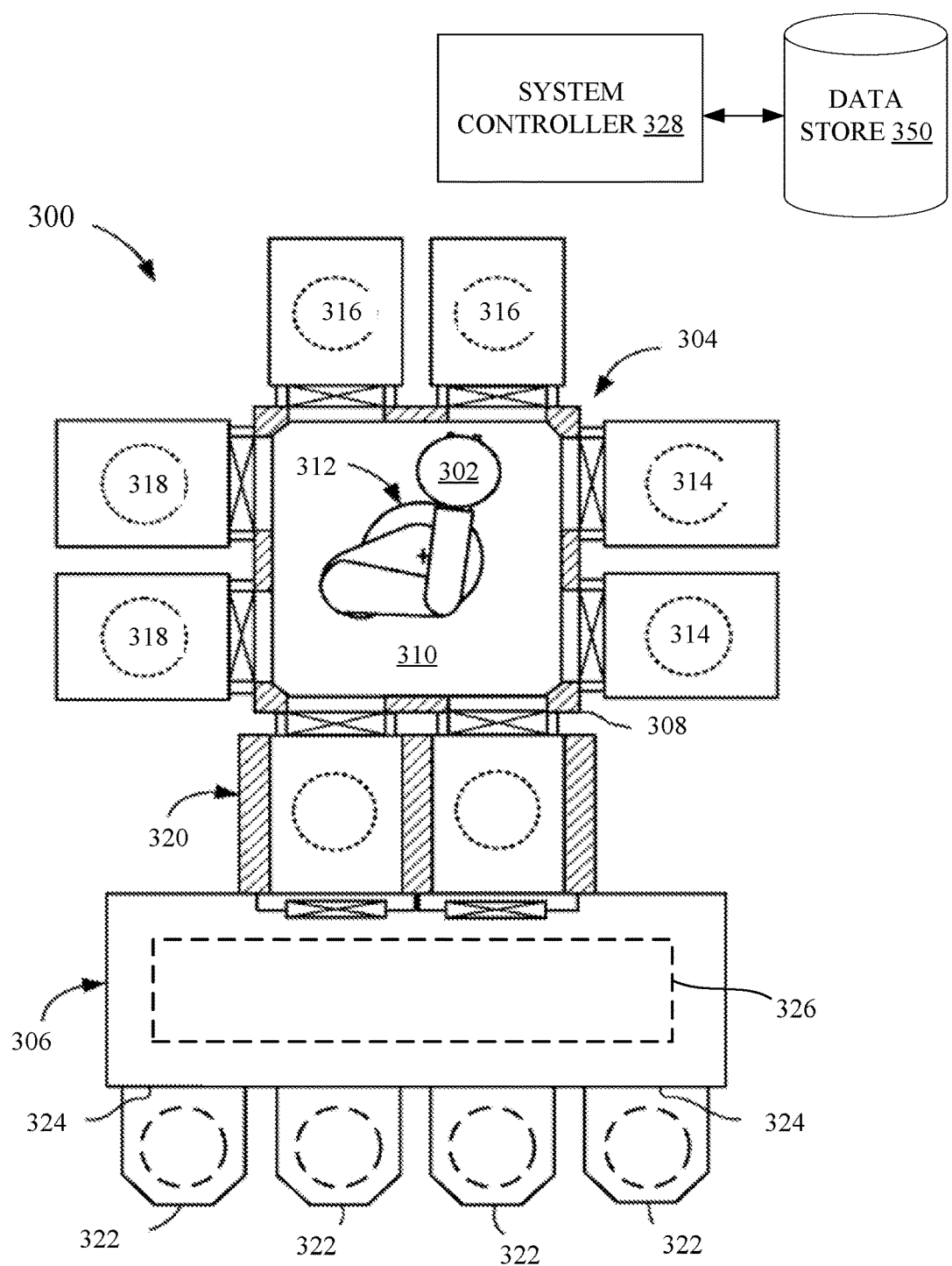
FIG. 3 is a top schematic view of an example manufacturing system, according to certain embodiments.

In some embodiments, a manufacturing system can include more than one process chambers. For example, example manufacturing system 300 of FIG. 3 illustrates multiple process chambers 314, 316, 318. It should be noted that, in some embodiments, data obtained to train the machine-learning model and data collected to be provided as input to the machine-learning model can be associated with the same process chamber of the manufacturing system. In other or similar embodiments, data obtained to train the machine-learning model and data collected to be provided as input to the machine-learning model can be associated with different process chambers of the manufacturing system. In other or similar embodiments, data obtained to train the machine-learning model can be associated with a process chamber of a first manufacturing system and data collected to be provide as input to the machine-learning model can be associated with a process chamber of a second manufacturing system.

FIG. 3 is a top schematic view of an example manufacturing system 300, according to aspects of the present disclosure. Manufacturing system 300 can perform one or more processes on a substrate 302. Substrate 302 can be any suitably rigid, fixed-dimension, planar article, such as, e.g., a silicon-containing disc or wafer, a patterned wafer, a glass plate, or the like, suitable for fabricating electronic devices or circuit components thereon.

Manufacturing system 300 can include a process tool 304 and a factory interface 306 coupled to process tool 304. Process tool 304 can include a housing 308 having a transfer chamber 310 therein. Transfer chamber 310 can include one or more process chambers (also referred to as processing chambers) 314, 316, 318 disposed therearound and coupled thereto. Process chambers 314, 316, 318 can be coupled to transfer chamber 310 through respective ports, such as slit valves or the like. Transfer chamber 310 can also include a transfer chamber robot 312 configured to transfer substrate 302 between process chambers 314, 316, 318, load lock 320, etc. Transfer chamber robot 312 can include one or multiple arms where each arm includes one or more end effectors at the end of each arm. The end effector can be configured to handle particular objects, such as wafers, sensor discs, sensor tools, etc.

Process chambers 314, 316, 318 can be adapted to carry out any number of processes on substrates 302. A same or different substrate process can take place in each processing chamber 314, 316, 318. A substrate process can include atomic layer deposition (ALD), physical vapor deposition (PVD), chemical vapor deposition (CVD), etching, annealing, curing, pre-cleaning, metal or metal oxide removal, or the like. Other processes can be carried out on substrates therein. Process chambers 314, 316, 318 can each include one or more sensors configured to capture data for substrate 302 before, after, or during a substrate process. For example, the one or more sensors can be configured to capture spectral data and/or non-spectral data for a portion of substrate 302 during a substrate process. In other or similar embodiments, the one or more sensors can be configured to capture data associated with the environment within process chamber 314, 316, 318 before, after, or during the substrate process. For example, the one or more sensors can be configured to capture data associated with a temperature, a pressure, a gas concentration, etc. of the environment within process chamber 314, 316, 318 during the substrate process.

In some embodiments, metrology equipment 128 (not shown) can be located within the process tool. In other embodiments, metrology equipment 128 (not shown) can be located within one or more process chambers 314, 316, 318. In some embodiments, the substrate can be placed onto metrology equipment 128 using transfer chamber robot 312. In other embodiments, the metrology equipment 128 can be part of the substrate support assembly (not shown). In one example, metrology equipment 128 can use reflectometry techniques to obtain reflectance data of one or more deposition layers during or after a deposition process.

A load lock 320 can also be coupled to housing 308 and transfer chamber 310. Load lock 320 can be configured to interface with, and be coupled to, transfer chamber 310 on one side and factory interface 306. Load lock 320 can have an environmentally-controlled atmosphere that can be changed from a vacuum environment (wherein substrates can be transferred to and from transfer chamber 310) to an at or near atmospheric-pressure inert-gas environment (wherein substrates can be transferred to and from factory interface 306) in some embodiments. Factory interface 306 can be any suitable enclosure, such as, e.g., an Equipment Front End Module (EFEM). Factory interface 306 can be configured to receive substrates 302 from substrate carriers 322 (e.g., Front Opening Unified Pods (FOUPs)) docked at various load ports 324 of factory interface 306. A factory interface robot 326 (shown dotted) can be configured to transfer substrates 302 between carriers (also referred to as containers) 322 and load lock 320. Carriers 322 can be a substrate storage carrier or a replacement part storage carrier.

Manufacturing system 300 can also be connected to a client device (not shown) that is configured to provide information regarding manufacturing system 300 to a user (e.g., an operator). In some embodiments, the client device can provide information to a user of manufacturing system 300 via one or more graphical user interfaces (GUIs). For example, the client device can provide information regarding a target thickness profile for a film to be deposited on a surface of a substrate 302 during a deposition process performed at a process chamber 314, 316, 318 via a GUI. The client device can also provide information regarding a modification to a process recipe in view of a respective set of deposition settings predicted to correspond to the target profile, in accordance with embodiments described herein.

Manufacturing system 300 can also include a system controller 328. System controller 328 can be and/or include a computing device such as a personal computer, a server computer, a programmable logic controller (PLC), a microcontroller, and so on. System controller 328 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 328 can include a data storage device (e.g., one or more disk drives and/or solid state drives), a main memory, a static memory, a network interface, and/or other components. System controller 328 can execute instructions to perform any one or more of the methodologies and/or embodiments described herein. In some embodiments, system controller 328 can execute instructions to perform one or more operations at manufacturing system 300 in accordance with a process recipe. The instructions can be stored on a computer readable storage medium, which can include the main memory, static memory, secondary storage and/or processing device (during execution of the instructions).

System controller 328 can receive data from sensors included on or within various portions of manufacturing system 300 (e.g., processing chambers 314, 316, 318, transfer chamber 310, load lock 320, etc.). In some embodiments, data received by the system controller 328 can include spectral data and/or non-spectral data for a portion of substrate 302. In other or similar embodiments, data received by the system controller 328 can include data associated with processing substrate 302 at processing chamber 314, 316, 318, as described previously. For purposes of the present description, system controller 328 is described as receiving data from sensors included within process chambers 314, 316, 318. However, system controller 328 can receive data from any portion of manufacturing system 300 and can use data received from the portion in accordance with embodiments described herein. In an illustrative example, system controller 328 can receive data from one or more sensors for process chamber 314, 316, 318 before, after, or during a substrate process at the process chamber 314, 316, 318. Data received from sensors of the various portions of manufacturing system 300 can be stored in a data store 350. Data store 350 can be included as a component within system controller 328 or can be a separate component from system controller 328. In some embodiments, data store 350 can be data store 140 described with respect to FIG. 1.

Figure 4:
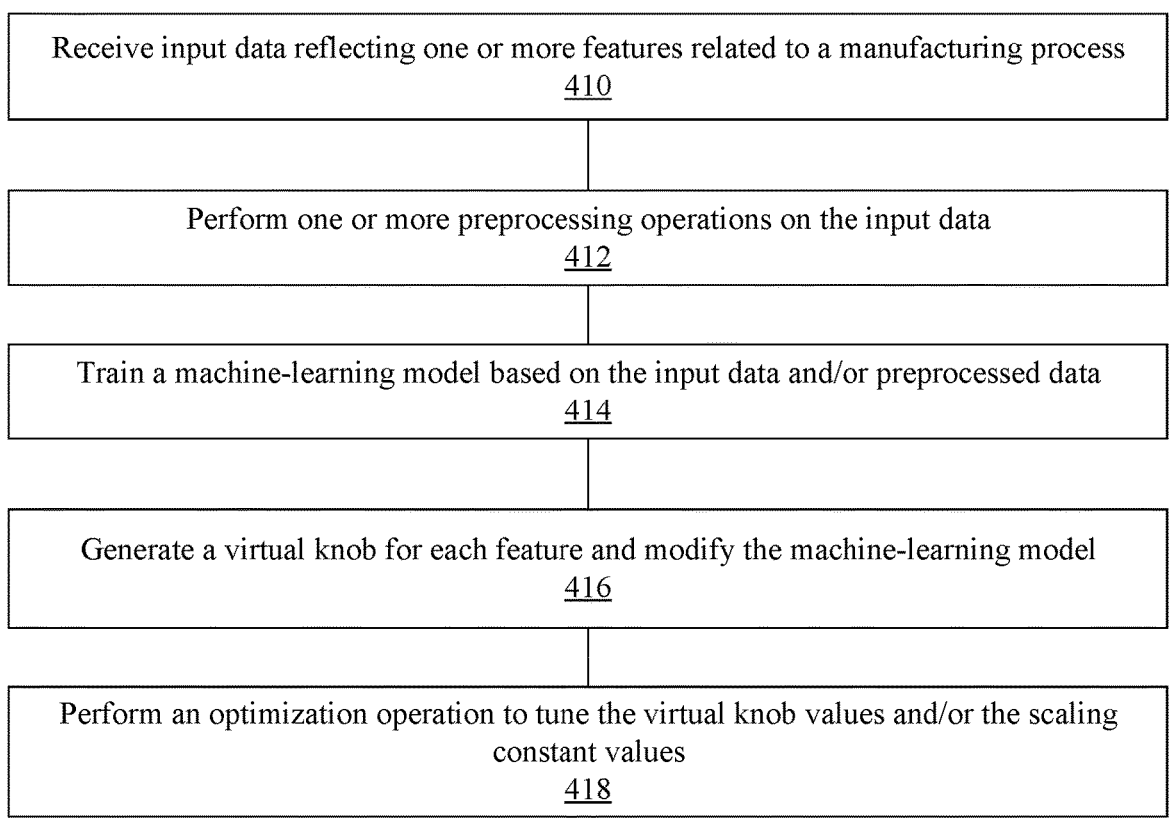
FIG. 4 is a flow chart of a method for generating virtual knobs for a machine-learning model, according to certain embodiments.

FIG. 4 is a flow chart of a method 400 for generating virtual knobs for a machine-learning model, according to aspects of the present disclosure. Method 400 is performed by processing logic that can include hardware (circuitry, dedicated logic, etc.), software (such as is run on a general purpose computer system or a dedicated machine), firmware, or some combination thereof. In one implementation, method 400 can be performed by a computer system, such as computer system architecture 100 of FIG. 1. In other or similar implementations, one or more operations of method 400 can be performed by one or more other machines not depicted in the figures. In some aspects, one or more operations of method 400 can be performed by client device 120, virtual knob server 150, server machine 170, server machine 180, and/or predictive server 112.

At operation 410, processing logic receive input data reflecting one or more features related to a manufacturing process. The one or more features can include any aspect of the manufacturing process that is regulated, monitored, controlled, or otherwise associated with one or more sets of sensors or controls. For example, a feature can include the gas flow, the chamber pressure, the control valve angle, the foreline pressure, the pump speed, the gas temperature, the chamber temperature, and so forth. In some embodiments, the one or more features can be selected using user input via UI component 121 of client device 120.

At operation 412, processing logic performs one or more preprocessing operations on the input data. In some embodiments, the preprocessing operations can include a smoothing operation, a normalization operation, a dimensions reduction operations, a sort features operation, or any other operation configured to prepare data for training a machine-learning model.

At operation 414, processing logic trains a machine-learning model based on the input data and/or preprocessed data (reflecting the feature). In some embodiments, processing logic can send preprocessed data (and/or the input data) to predictive system 110 to generate the machine-learning model (e.g., machine-learning model 190). The machine-learning model can include a representative function for each selected feature. For example, in one such embodiment, the machine-learning function can be represented by Formula 1 ($y=\beta_0+c_1x_1+c_2x_2+c_3x_3+\ldots$), where each x value represents a selected feature.

At operation 416, processing logic can generate a virtual knob for each selected feature and modify the machine-learning model in view of the virtual knob for the feature. Each virtual knob can be capable of adjusting the representative value of the corresponding feature, thus adjusting the machine-learning model. In some embodiments, to generate a virtual knob, processing logic can use a transform function (or any other applicable function) to modify one or more values representing each feature in the machine-learning model. For example, processing logic can modify the feature value to include a value representing a virtual knob and a scaling constant (e.g., Formula 2: $y=Po+c_1(x_1+k_1w_1)+c_2(x_2+k_2w_2)+c_3(x_3+k_3w_3)+\ldots$). As shown, the feature value ($x_1, x_2, \ldots$) is adjusted by adding, to the feature value, the product of the virtual knob value ($k_1, k_2, \ldots$) and the scaling constant ($w_1, w_2, \ldots$). In another embodiment, the feature value ($x_1, x_2, \ldots$) can be adjusted by multiplying the feature value with the product of the virtual knob value and the scaling constant. In other embodiments, other methods can be used to generate virtual knobs and modify the machine-learning model (e.g., Formula 3: $y=(\beta_0+c_1k_1w_1+c_2k_2w_2+c_3k_3w_3)+c_1x_1+c_2x_2+c_3x_3+\ldots$). The machine-learning model modified to include virtual knobs can be referred to as a "modified machine-learning model."

In some embodiments, processing logic can determine confidence interval for each virtual knob. A confidence interval displays the probability that a parameter (e.g., virtual knob value) will fall between a pair of values around a mean. Confidence intervals measure the degree of uncertainty or certainty in a sampling method. In one embodiment, to determine a confidence interval for a virtual knob, processing logic can first determine a confidence interval of the intercept value (e.g., Po). In one example, processing logic can determine the confidence level of the intercept value using Formula 4, expressed below.

$$CI_{0.95}=[\widehat{\beta_0}-t_{0.95}*SE(\widehat{\beta_0}), \widehat{\beta_0}+t_{0.95}*SE(\widehat{\beta_0})] \quad \text{Formula 4}$$

where: $CI_{0.95}$ is the confidence interval with a 95% confidence level $\widehat{\beta_0}$ is the estimator of a parameter (e.g., a virtual knob value)

$t_{0.95}$ is the t-statistic (e.g., ratio of the departure of the estimated value of a parameter from its hypothesized value to its standard error)

SE is the standard error of the estimator $k_{i,\ 0.95}$ is the i-th knob value with 95% confidence level $w_i$ is the i-th knob weighting.

Next, processing logic calculates the interval of each virtual knob based on the $CI_{0.95}$ value using, for example, Formula 5, expressed below:

$$k_{i,0.95}=CI_{0.95}/w_i-\widehat{\beta_0} \quad \text{Formula 5}$$

In an illustrative example, a trained machine-learning model reflecting three features can be expressed as: $y=2190+20x_1+3.4x_2+0.2x_3$. The determined scaling constants can be expressed as $$w = \left[\frac{1}{20}, \frac{0.1}{3.4}, \frac{0.01}{0.2}\right].$$

Thus, the $CI_{0.95}$ for the intercept value can be calculated to be [2190−0.5, 2190+0.5], and the confidence interval for virtual knob $k_1$ can be expressed as $k_{1,\ 0.95}=CI_{0.95}/w_1-\widehat{\beta_0}=[-0.5*(1/20), 0.5*(1/20)]=[-10, 10]$.

At operation 418, processing logic performs an optimization operation to tune the virtual knob values and/or the scaling constant values. For example, processing logic can apply the Nelder-Mead method, or any other optimization operation to adjust the virtual knob values and/or the scaling constant values.

Figure 5:
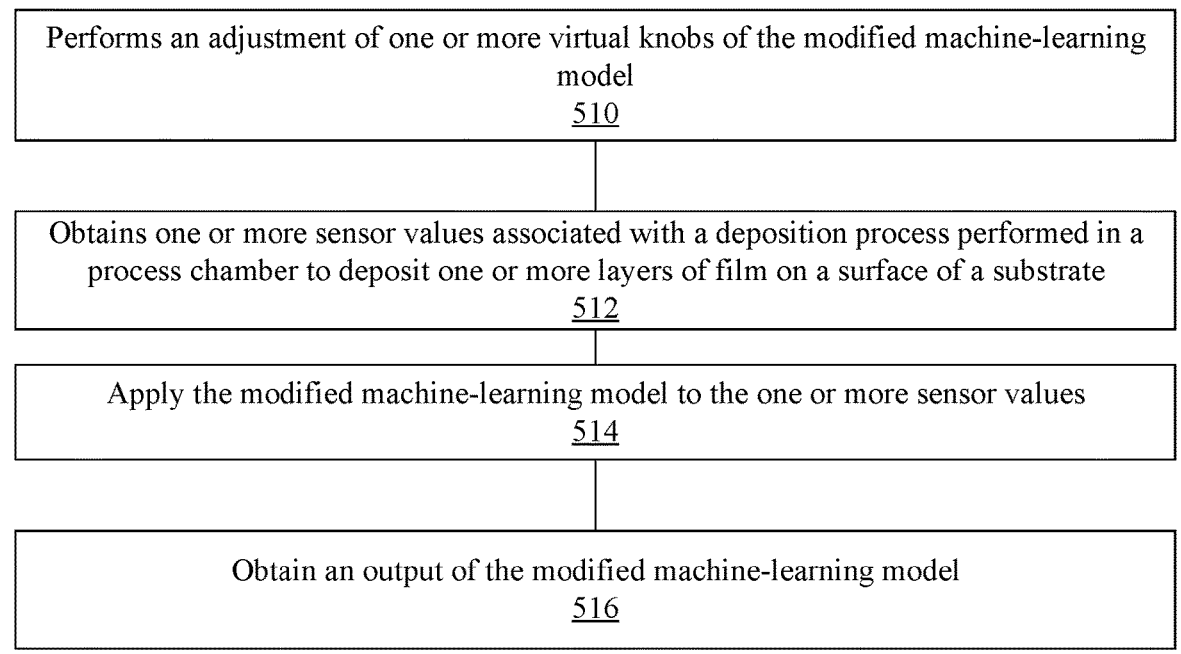
FIG. 5 is a flow diagram of a method for determining predictive metrology data using the modified machine-learning model, according to certain embodiments.

FIG. 5 is a flow chart of a method 500 for determining predictive data using the modified machine-learning model, according to aspects of the present disclosure. Method 500 is performed by processing logic that can include hardware (circuitry, dedicated logic, etc.), software (such as is run on a general purpose computer system or a dedicated machine), firmware, or some combination thereof. In one implementation, method 500 can be performed by a computer system, such as computer system architecture 100 of FIG. 1. In other or similar implementations, one or more operations of method 500 can be performed by one or more other machines not depicted in the figures. In some aspects, one or more operations of method 500 can be performed by server machine 170, server machine 180, and/or predictive server 112.

At operation 510, processing logic performs an adjustment of one or more virtual knobs of the modified machine-learning model. The modified machine-learning model can be a machine-learning model that includes one or more virtual knobs. In some embodiments, an adjustment includes user input adjusting one or more values related to a virtual knob. In some embodiments, the machine-learning model can be trained using method 200, and can be modified with virtual knobs using method 400.

At operation 512, processing logic obtains one or more sensor values associated with a deposition process performed in a process chamber to deposit one or more layers of film on a surface of a substrate.

At operation 514, processing logic applies the machine learning model to the one or more sensor values. For example, the processing logic can input the sensor values into the machine-learning model.

At operation 516, processing logic obtains an output of the modified machine-learning model. In some embodiments, the modified machine-learning model output can identify predictive metrology data for one or more layers of film. In some embodiments, the predictive metrology data includes a thickness profile. For example, the predictive metrology data can include a contour map having a set of spatial measurements, each spatial measurement indicating a thickness of a particular location of a plurality of locations on one or more layers on the substrate. In some embodiments, the predictive metrology data indicates an average predictive layer thickness.

In some embodiments, processing logic can generate a corrective action or updated a process recipe, based on the virtual knob values, by adjusting the parameters associated with the manufacturing process or values associated with the process recipe. For example, a correction profile have one or more adjustments can be applied to one or more steps of the current deposition process or a process recipe. This can be performed in response to use input, or automatically based on one or more predefined conditions (e.g., a sensor value satisfying a threshold criterion, such as a threshold value). Thus, the processing logic can perform, on the substrate, a subsequent step of the process recipe according to the updated process recipe. In some embodiments, the subsequent step comprises another deposition step. In some embodiments, the update process recipe can be used to perform additional deposition steps on the substrate. Accordingly, the deposition process recipe can be adjusted in real or near real-time.

Figure 6:
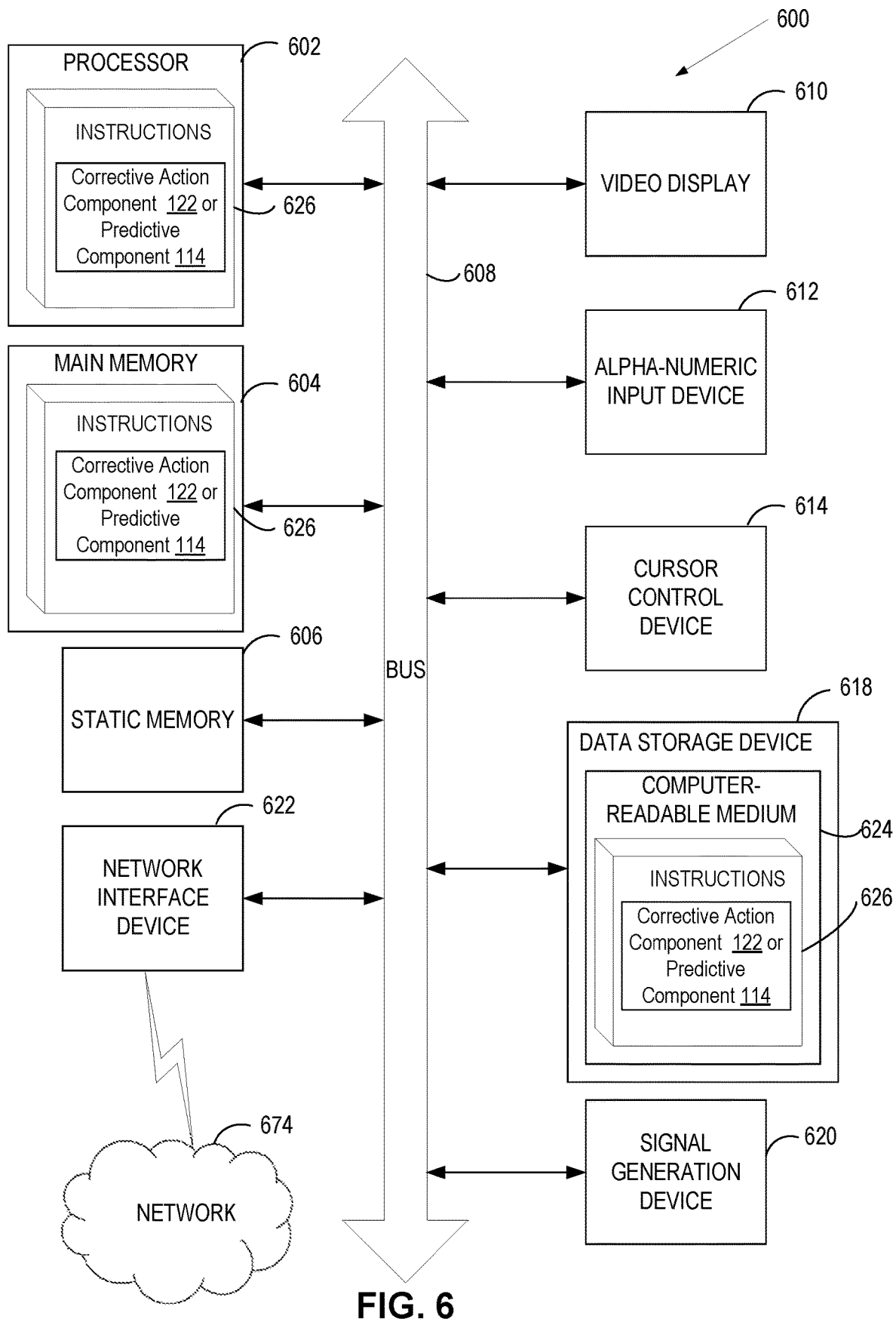
FIG. 6 is a block diagram illustrating a computer system, according to certain embodiments.

FIG. 6 is a block diagram illustrating a computer system 600, according to certain embodiments. In some embodiments, computer system 600 can be connected (e.g., via a network, such as a Local Area Network (LAN), an intranet, an extranet, or the Internet) to other computer systems. Computer system 600 can operate in the capacity of a server or a client computer in a client-server environment, or as a peer computer in a peer-to-peer or distributed network environment. Computer system 600 can be provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 600 can include a processing device 602, a volatile memory 604 (e.g., Random Access Memory (RAM)), a non-volatile memory 606 (e.g., Read-Only Memory (ROM) or Electrically-Erasable Programmable ROM (EEPROM)), and a data storage device 616, which can communicate with each other via a bus 608.

Processing device 602 can be provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor).

Computer system 600 can further include a network interface device 622 (e.g., coupled to network 674). Computer system 600 also can include a video display unit 610 (e.g., an LCD), an alphanumeric input device 612 (e.g., a keyboard), a cursor control device 614 (e.g., a mouse), and a signal generation device 620.

In some implementations, data storage device 616 can include a non-transitory computer-readable storage medium 624 on which can store instructions 626 encoding any one or more of the methods or functions described herein, including instructions encoding components of FIG. 1 (e.g., user interface component 121, corrective action component 122, predictive component 114, etc.) and for implementing methods described herein.

Instructions 626 can also reside, completely or partially, within volatile memory 604 and/or within processing device 602 during execution thereof by computer system 600, hence, volatile memory 604 and processing device 602 can also constitute machine-readable storage media.

While computer-readable storage medium 624 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein can be implemented by discrete hardware components or can be integrated in the functionality of other hardware components such as ASICS, FPGAs, DSPs or similar devices. In addition, the methods, components, and features can be implemented by firmware modules or functional circuitry within hardware devices. Further, the methods, components, and features can be implemented in any combination of hardware devices and computer program components, or in computer programs.

Unless specifically stated otherwise, terms such as "receiving," "performing," "providing," "obtaining," "causing," "accessing," "determining," "adding," "using," "training," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and can not have an ordinal meaning according to their numerical designation.

Examples described herein also relate to an apparatus for performing the methods described herein. This apparatus can be specially constructed for performing the methods described herein, or it can include a general purpose computer system selectively programmed by a computer program stored in the computer system. Such a computer program can be stored in a computer-readable tangible storage medium.

The methods and illustrative examples described herein are not inherently related to any particular computer or other apparatus. Various general purpose systems can be used in accordance with the teachings described herein, or it can prove convenient to construct more specialized apparatus to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A method comprising:
   receiving, by a processor, input data reflecting a feature related to a manufacturing process of a substrate;
   providing a trained machine learning model trained based on the input data reflecting the feature;
   generating a virtual knob for the trained machine learning model, wherein the virtual knob is configured to adjust a representative value of the trained machine learning model that is associated with the feature, to control a performance of the trained machine learning model; and
   modifying, based on input received via the virtual knob, the trained machine learning model by adjusting the representative value.

2. The method of claim 1, further comprising:
   obtaining, by a processor, sensor data associated with at least one of a deposition process performed in a process chamber to deposit film on a surface of a substrate, an etch process performed on the substrate, or a chemical-mechanical planarization (CMP) process performed on the substrate;
   inputting the sensor data into the modified machine learning model; and
   obtaining an output value of the modified machine learning model, the output value being indicative of metrology data.

3. The method of claim 1, further comprising:
   performing one or more preprocessing operations on the input data to generate preprocessed data; and
   training the machine learning model based on the preprocessed data.

4. The method of claim 1, wherein the feature relates to an aspect of the manufacturing process that is regulated, monitored, controlled, or associated with one or more sets of sensors or controls.

5. The method of claim 1, wherein the feature relates to at least one of a gas flow, a chamber pressure, a control valve angle, a foreline pressure, a pump speed, a gas temperature, reflectance data, or a chamber temperature.

6. The method of claim 1, wherein the virtual knob comprises a virtual knob value and a scaling constant.

7. The method of claim 1, further comprising:
   optimizing the virtual knob using an optimization operation.

8. The method of claim 1, further comprising:
   performing a corrective action or updating a process recipe based on a value associated with the virtual knob.

9. The method of claim 1, further comprising:
   generating a confidence interval for the virtual knob.

10. An electronic device manufacturing system, comprising:
    a memory device; and
    a processing device, operatively coupled to the memory device, to perform operations comprising:
      receiving input data reflecting a feature related to a manufacturing process of a substrate;
      providing a trained machine learning model trained based on the input data reflecting the feature;
      generating a virtual knob for the trained machine learning model, wherein the virtual knob is configured to adjust a representative value of the trained machine learning model that is associated with the feature, to control a performance of the trained machine learning model; and
      modifying, based on input received via the virtual knob, the trained machine learning model by adjusting the representative value.

11. The electronic device manufacturing system of claim 10, wherein the processing device is further to perform operations comprising:
    obtaining sensor data associated with at least one of a deposition process performed in a process chamber to deposit film on a surface of a substrate, an etch process performed on the substrate, or a chemical-mechanical planarization (CMP) process performed on the substrate;
    inputting the sensor data into the modified machine learning model; and obtaining an output value of the modified machine learning model, the output value being indicative of metrology data.

12. The electronic device manufacturing system of claim 10, wherein the processing device is further to perform operations comprising:

performing one or more preprocessing operations on the input data to generate preprocessed data; and training the machine learning model based on the preprocessed data.

13. The electronic device manufacturing system of claim 10, wherein the feature relates to an aspect of the manufacturing process that is regulated, monitored, controlled, or associated with one or more sets of sensors or controls.

14. The electronic device manufacturing system of claim 10, wherein the feature relates to at least one of a gas flow, a chamber pressure, a control valve angle, a foreline pressure, a pump speed, a gas temperature, reflectance data, or a chamber temperature.

15. The electronic device manufacturing system of claim 10, wherein the virtual knob comprises a virtual knob value and a scaling constant.

16. The electronic device manufacturing system of claim 10, wherein the processing device is further to perform operations comprising:

optimizing the virtual knob using an optimization operation.

17. The electronic device manufacturing system of claim 10, wherein the processing device is further to perform operations comprising:

performing a corrective action or updating a process recipe based on a value associated with the virtual knob.

18. The electronic device manufacturing system of claim 10, wherein the processing device is further to perform operations comprising:

generating a confidence interval for the virtual knob.

19. A non-transitory computer-readable storage medium comprising instructions that, when executed by a processing device operatively coupled to a memory, performs operations comprising:

receiving input data reflecting a feature related to a manufacturing process of a substrate;

providing a trained machine learning model trained based on the input data reflecting the feature;

generating a virtual knob for the trained machine learning model, wherein the virtual knob is configured to adjust a representative value of the trained machine learning model that is associated with the feature, to control a performance of the trained machine learning model; and modifying, based on input received via the virtual knob, the trained machine learning model by adjusting the representative value.

20. The non-transitory computer-readable storage medium of claim 19, wherein the processing device is further to perform operations comprising:

performing one or more preprocessing operations on the input data to generate preprocessed data; and training the machine learning model based on the preprocessed data.

\* \* \* \* \*